(12) United States Patent
Takahashi (10) Patent No.: US 11,108,063 B2
(45) Date of Patent: Aug. 31, 2021

(54) FUEL CELL SYSTEM

(71) Applicant: TOYOTA JIDOSHA KABUSHIKI KAISHA, Toyota (JP)

(72) Inventor: Manabu Takahashi, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 234 days.

(21) Appl. No.: 16/410,518

(22) Filed: May 13, 2019

(65) Prior Publication Data

US 2020/0036021 A1  Jan. 30, 2020

(30) Foreign Application Priority Data

Jul. 26, 2018  (JP) .............................. JP2018-139949

(51) Int. Cl.
| | |
|---|---|
| *H01M 8/04* | (2016.01) |
| *H01M 8/0432* | (2016.01) |
| *H01M 8/0444* | (2016.01) |
| *H01M 8/04119* | (2016.01) |
| *H01M 8/04029* | (2016.01) |
| *H01M 8/04082* | (2016.01) |
| *H01M 8/04228* | (2016.01) |
| *H01M 8/04746* | (2016.01) |
| *G01R 31/3842* | (2019.01) |
| *B60L 58/12* | (2019.01) |
| *H01M 8/04701* | (2016.01) |

(52) U.S. Cl.
CPC ......... *H01M 8/04365* (2013.01); *B60L 58/12* (2019.02); *G01R 31/3842* (2019.01); *H01M 8/04029* (2013.01); *H01M 8/04164* (2013.01); *H01M 8/04201* (2013.01); *H01M 8/04228* (2016.02); *H01M 8/04373* (2013.01); *H01M 8/04731* (2013.01); *H01M 8/04753* (2013.01); *H01M 2250/20* (2013.01)

(58) Field of Classification Search
CPC .... H01M 8/04; H01M 8/0432; H01M 8/0429; H01M 8/06; H01M 8/04228
See application file for complete search history.

(56) References Cited

U.S. PATENT DOCUMENTS

2007/0111058 A1* 5/2007 Yoshida ............ H01M 8/04231
429/408
2016/0380283 A1  12/2016 Yamada et al.

FOREIGN PATENT DOCUMENTS

JP  2017010908 A  1/2017

* cited by examiner

*Primary Examiner* — Kenneth J Douyette
(74) *Attorney, Agent, or Firm* — Dickinson Wright, PLLC (57) ABSTRACT

A fuel cell system includes a component in a circulation passage for off-gas, a battery temperature acquisition unit configured to acquire a fuel cell temperature, a component temperature acquisition unit configured to acquire a component temperature, a state-of-charge acquisition unit configured to acquire a state of charge of a secondary battery, and a controller configured to, when a temperature difference between the acquired fuel cell temperature and the acquired component temperature is greater than or equal to a predetermined temperature difference at the time of a stop of power generation of the fuel cell system, perform a warm-up operation of a fuel cell and store electric power generated through the warm-up operation in the secondary battery while the state of charge of the secondary battery is lower than a predetermined state of charge, and, after completion of the warm-up operation, perform the scavenging operation at predetermined scavenging power.

3 Claims, 4 Drawing Sheets

FUEL CELL SYSTEM

INCORPORATION BY REFERENCE

The disclosure of Japanese Patent Application No. 2018-139949 filed on Jul. 26, 2018 including the specification, drawings and abstract is incorporated herein by reference in its entirety.

BACKGROUND

1. Technical Field

The disclosure relates to a fuel cell system.

2. Description of Related Art

Water produced during operation, water for humidifying reactant gas, and other water are present inside a fuel cell. When the temperature of a fuel cell decreases to below-freezing temperature after a stop of the operation of the fuel cell, water remaining inside the fuel cell, for example, in pores of a catalyst layer or gas diffusion layer in a single cell freezes and limits a flow of reactant gas or off-gas at next startup. For this reason, a fuel cell system that performs a scavenging operation after a stop of the fuel cell has been suggested. In a fuel cell system described in Japanese Unexamined Patent Application Publication No. 2017-010908 (JP 2017-010908 A), after a quick warm-up operation for quickly raising the temperature of a fuel cell is performed, a normal warm-up operation that is lower in the rate of rise in the temperature of the fuel cell than the quick warm-up operation is performed, and then a scavenging operation of the fuel cell is performed.

SUMMARY

However, the fact is that a scavenging operation of a fuel cell is not sufficiently devised. For example, in the fuel cell system described in JP 2017-010908 A, when the temperature of the fuel cell is high and the temperature of a gas flow auxiliary is low, the operation mode is switched from the quick warm-up operation to the normal warm-up operation and then the scavenging operation is performed. Therefore, for example, after startup of the fuel cell system left in a low-temperature environment, when the fuel cell system is operated in a short time and then stopped, the temperature of the fuel cell can decrease while the temperature of the gas flow auxiliary remains low. At this time, when the temperature of the gas flow auxiliary is warmed up to 10° C. to 20° C. as in the case of the embodiment of JP 2017-010908 A, such inconvenience does not arise; however, energy is wasted for raising the temperature of the gas flow auxiliary. On the other hand, when the temperature of the gas flow auxiliary is not raised, the inside of the gas flow auxiliary is filled with warm, humid off-gas discharged from the fuel cell, and moisture contained in the off-gas can freeze. Hence, a technique for making it possible to appropriately perform a scavenging operation of a fuel cell is sought.

(1) A fuel cell system according to an aspect of the disclosure includes a fuel cell, a reactant gas supply unit configured to supply reactant gases to the fuel cell, a component provided in a circulation passage for off-gas that is discharged from the fuel cell, a battery temperature acquisition unit configured to acquire a fuel cell temperature that is a temperature of the fuel cell, a component temperature acquisition unit configured to acquire a component temperature that is a temperature of the component, a secondary battery, a state-of-charge acquisition unit configured to acquire a state of charge of the secondary battery, and a controller configured to perform a scavenging operation of the fuel cell at the time of a stop of power generation of the fuel cell system. The control unit is configured to, when a temperature difference that is a difference between the acquired fuel cell temperature and the acquired component temperature is greater than or equal to a predetermined temperature difference, perform a warm-up operation of the fuel cell and store electric power generated through the warm-up operation in the secondary battery while the state of charge of the secondary battery is lower than a predetermined state of charge, and, after completion of the warm-up operation, perform the scavenging operation at predetermined scavenging power. With the fuel cell system according to this aspect, when the temperature difference that is the difference between the acquired fuel cell temperature and the acquired component temperature is greater than or equal to the predetermined temperature difference, the warm-up operation of the fuel cell is performed and electric power generated through the warm-up operation is stored in the secondary battery while the state of charge of the secondary battery is lower than the predetermined state of charge, and, after completion of the warm-up operation, the scavenging operation is performed at the predetermined scavenging power. Therefore, the scavenging operation of the fuel cell is performed in a state where the temperature of the component is raised through the warm-up operation. As a result, the remaining amount of off-gas and water flowing into the component is reduced, and freezing of water and moisture (water vapor) contained in off-gas in the component is minimized even when outside air temperature is low and, therefore, the temperature of the component is low. Therefore, at the time of next startup of the fuel cell, a malfunction of power generation resulting from blockage of part or all of the circulation passage is reduced.

(2) In the fuel cell system according to the above aspect, the controller may be configured to, when the temperature difference is greater than or equal to the predetermined temperature difference at the time when the state of charge of the secondary battery has reached the predetermined state of charge in the warm-up operation, perform the scavenging operation at scavenging power higher than the predetermined scavenging power after completion of the warm-up operation. With the fuel cell system according to this aspect, when the temperature difference is greater than or equal to the predetermined temperature difference at the time when the state of charge of the secondary battery has reached the predetermined state of charge in the warm-up operation, perform the scavenging operation at scavenging power higher than the predetermined scavenging power after completion of the warm-up operation. Therefore, power in the component for emitting off-gas and water discharged from the fuel cell is enhanced. As a result, even when the temperature difference is greater than or equal to the predetermined temperature difference after completion of the warm-up operation, freezing of water and moisture contained in off-gas in the component is minimized.

The disclosure may be implemented in various embodiments. For example, the disclosure may be implemented in modes such as a vehicle including a fuel cell system, a control method for a fuel cell system, and a scavenging control method in a fuel cell system.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A. First Embodiment

A1. Configuration of Fuel Cell System

Figure 1:
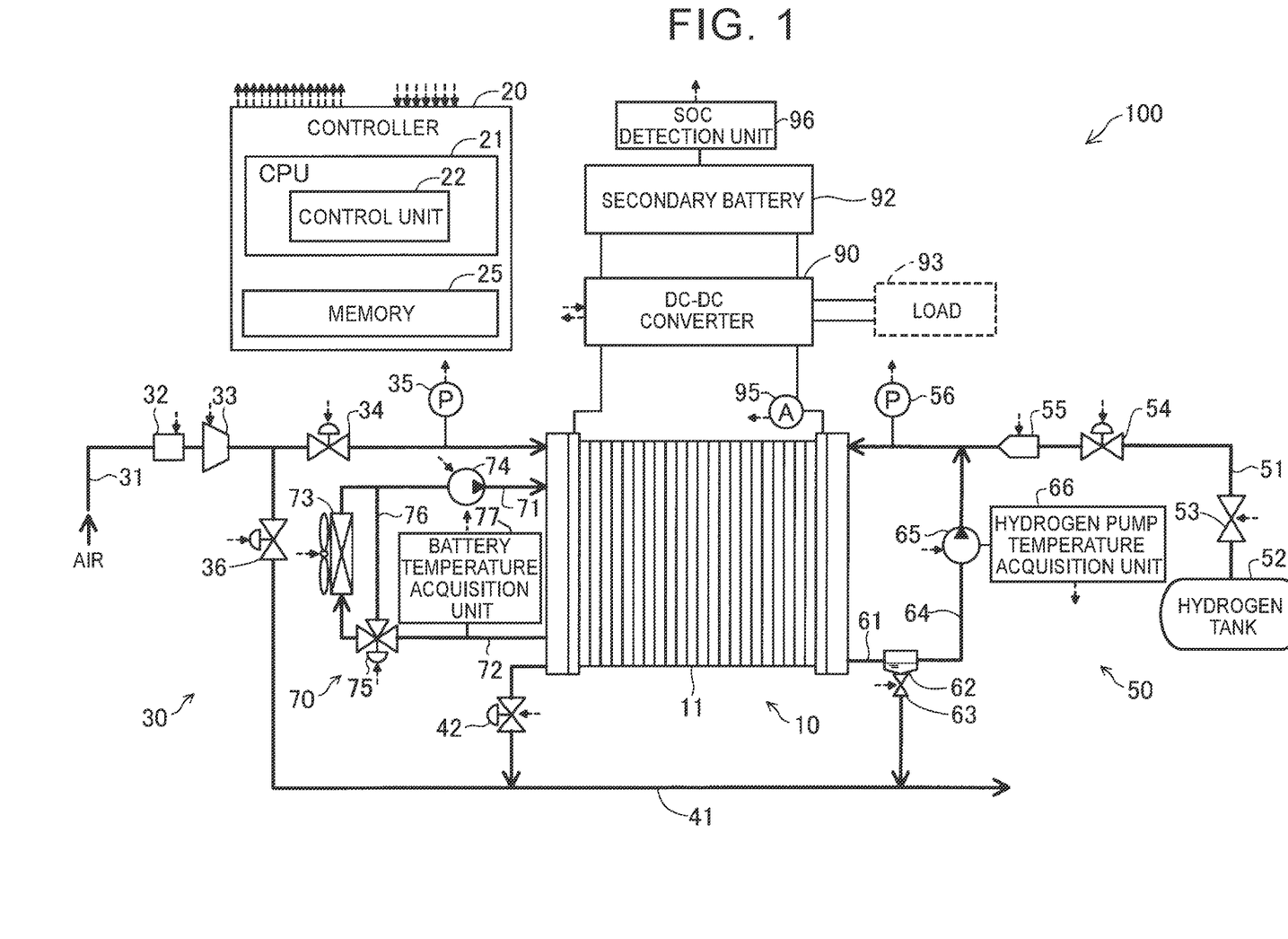
FIG. 1 is a schematic diagram showing the configuration of a fuel cell system.

FIG. 1 is a schematic diagram showing the configuration of a fuel cell system 100 that is one embodiment of the disclosure. The fuel cell system 100 is mounted on, for example, a vehicle. The fuel cell system 100 outputs electric power that is a power source of the vehicle in response to a request from a driver. The fuel cell system 100 includes a fuel cell 10, an oxidant gas supply and exhaust unit 30, a fuel gas supply and exhaust unit 50, a cooling medium circulation unit 70, and a controller 20. The fuel cell system 100 further includes a DC-DC converter 90 and a secondary battery 92.

The fuel cell 10 is a polymer electrolyte fuel cell that generates electric power upon receiving hydrogen gas and air supplied as reactant gases. The fuel cell 10 has a stacking structure in which a plurality of cells 11 is stacked on top of each other. Although not shown in the diagram, each cell 11 includes a membrane electrode assembly, a pair of gas diffusion layers, and a pair of separators. The membrane electrode assembly is formed such that electrodes are respectively disposed on both faces of an electrolyte. The pair of gas diffusion layers and the pair of separators sandwich the membrane electrode assembly. Electric power generated by the fuel cell 10 is supplied to the secondary battery 92 or a load 93 via the DC-DC converter 90.

The secondary battery 92 stores electric power generated by the fuel cell 10. The secondary battery 92 functions as an electric power supply source in the fuel cell system 100 together with the fuel cell 10. Electric power stored in the secondary battery 92 is supplied to the load 93, such as a traction motor (not shown), an air compressor 33 (described later), a hydrogen pump 65, and various valves. In the present embodiment, the secondary battery 92 is a chargeable and dischargeable lithium ion battery. Alternatively, the secondary battery 92 may be a battery of any other type, such as a lead storage battery, a nickel-cadmium battery, and a nickel-metal hydride battery.

An SOC detection unit 96 detects the state of charge (SOC) of the secondary battery 92 and transmits the SOC to the controller 20. In the present embodiment, SOC means the ratio of a charged level to the charging capacity of the secondary battery 92. The SOC detection unit 96 detects the temperature, output voltage, and output current of the secondary battery 92, and detects the SOC based on these detected values.

The oxidant gas supply and exhaust unit 30 takes in air as oxidant gas from outside air and supplies the air to the fuel cell 10. The oxidant gas supply and exhaust unit 30 also discharges cathode off-gas from the fuel cell 10 to the outside. The oxidant gas supply and exhaust unit 30 includes an oxidant gas pipe 31, an air flow meter 32, the air compressor 33, a first on-off valve 34, a first pressure gauge 35, a flow dividing valve 36, an oxidation off-gas pipe 41, and a first pressure regulating valve 42.

The oxidant gas pipe 31 communicates with a cathode-side supply manifold formed inside the fuel cell 10, and supplies the fuel cell 10 with air taken in from the outside. The air flow meter 32 is provided in the oxidant gas pipe 31. The air flow meter 32 measures the flow rate of taken-in air. The air compressor 33 is provided between the air flow meter 32 and a connection point of the oxidant gas pipe 31 to the oxidation off-gas pipe 41. The air compressor 33 compresses air taken in from outside air and supplies the air to the fuel cell 10 in response to a control signal from the controller 20. The first on-off valve 34 is provided between the air compressor 33 and the fuel cell 10. The first on-off valve 34 supplies or stops air from the air compressor 33 to the fuel cell 10. The first pressure gauge 35 measures the pressure at an oxidant gas inlet of the fuel cell 10 and transmits the pressure to the controller 20. The flow dividing valve 36 is provided between the air compressor 33 and the oxidation off-gas pipe 41. The flow dividing valve 36 adjusts the flow rate of air to the fuel cell 10 and to the oxidation off-gas pipe 41.

The oxidation off-gas pipe 41 communicates with a cathode-side exhaust manifold formed inside the fuel cell 10. The oxidation off-gas pipe 41 emits cathode off-gas to the outside of the fuel cell system 100 (to the atmosphere). The cathode off-gas is discharged from the cells 11. The first pressure regulating valve 42 adjusts the pressure at a cathode gas outlet of the fuel cell 10 in response to a control signal from the controller 20.

The fuel gas supply and exhaust unit 50 supplies hydrogen gas as fuel gas to the fuel cell 10 and discharges anode off-gas from the fuel cell 10 to the outside. The fuel gas supply and exhaust unit 50 includes a fuel gas pipe 51, a hydrogen gas tank 52, a second on-off valve 53, a second pressure regulating valve 54, an injector 55, a second pressure gauge 56, a fuel off-gas pipe 61, a gas-liquid separator 62, an exhaust drain valve 63, a circulation pipe 64, and the hydrogen pump 65.

The fuel gas pipe 51 connects the hydrogen gas tank 52 to the fuel cell 10. The fuel gas pipe 51 supplies fuel cell 10 with hydrogen gas stored in the hydrogen gas tank 52 and redundant hydrogen gas that is fed from the hydrogen pump 65. The second on-off valve 53, the second pressure regulating valve 54, the injector 55, and the second pressure gauge 56 are disposed in the fuel gas pipe 51 in this order from the hydrogen gas tank 52 toward the fuel cell 10.

The second on-off valve 53 opens or closes in response to a control signal from the controller 20. The second on-off valve 53 controls a flow of hydrogen gas from the hydrogen gas tank 52 into the injector 55. When the fuel cell system 100 is stopped, the second on-off valve 53 is closed. The second pressure regulating valve 54 adjusts the pressure of hydrogen gas to be supplied to the injector 55 to a predetermined pressure in response to a control signal from the controller 20. The injector 55 opens or closes its valve in accordance with a driving period and open/close time set by the controller 20 in response to a control signal from the controller 20. Thus, the injector 55 supplies hydrogen gas to the fuel cell 10 and also adjusts the amount of hydrogen gas supplied. The second pressure gauge 56 measures the pressure at a hydrogen gas inlet of the fuel cell 10 and transmits the pressure to the controller 20.

The fuel off-gas pipe 61 connects the gas-liquid separator 62 to an anode-side exhaust manifold formed inside the fuel cell 10. The fuel off-gas pipe 61 is a passage for discharging anode off-gas from the fuel cell 10. The fuel off-gas pipe 61 guides anode off-gas to the gas-liquid separator 62. The anode off-gas contains hydrogen gas, nitrogen gas, and the like, not used for power generation reaction.

The gas-liquid separator 62 is connected between the fuel off-gas pipe 61 and the circulation pipe 64. The gas-liquid separator 62 separates hydrogen gas and water contained in anode off-gas in the fuel off-gas pipe 61, allows gas including hydrogen gas to flow into the circulation pipe 64, and stores water.

The exhaust drain valve 63 is an on-off valve provided at the lower portion of the gas-liquid separator 62. The exhaust drain valve 63 opens or closes in response to a control signal from the controller 20. The exhaust drain valve 63 drains or discharges water separated by the gas-liquid separator 62 and impurity gas, such as nitrogen gas, contained in anode off-gas to the oxidation off-gas pipe 41.

The circulation pipe 64 is connected to the fuel gas pipe 51 at a location downstream of the injector 55. The hydrogen pump 65 is disposed in the circulation pipe 64. The hydrogen pump 65 is driven in response to a control signal from the controller 20. The hydrogen pump 65 feeds gas separated by the gas-liquid separator 62 (gas containing hydrogen gas) to the fuel gas pipe 51. In the fuel cell system 100, the use efficiency of hydrogen gas is improved by circulating gas containing hydrogen gas, contained in anode off-gas, and supplying the gas to the fuel cell 10 again.

The hydrogen pump 65 is provided with a hydrogen pump temperature acquisition unit 66. The hydrogen pump temperature acquisition unit 66 measures the temperature of the hydrogen pump 65 and transmits the temperature to the controller 20. In the present embodiment, the temperature of the hydrogen pump 65, measured by the hydrogen pump temperature acquisition unit 66, is used as a component temperature.

The cooling medium circulation unit 70 adjusts the temperature of the fuel cell 10 (hereinafter, referred to as fuel cell temperature) by circulating a cooling medium via the fuel cell 10. In the present embodiment, unfreezable water, such as ethylene glycol, is used as the cooling medium. The cooling medium is not limited to unfreezable water. Air may be used as the cooling medium. The cooling medium circulation unit 70 includes a cooling medium supply pipe 71, a cooling medium exhaust pipe 72, a radiator 73, a circulation pump 74, a three-way valve 75, a bypass pipe 76, and a battery temperature acquisition unit 77.

The cooling medium supply pipe 71 is connected to a cooling medium supply manifold formed inside the fuel cell 10. The cooling medium exhaust pipe 72 is connected to a cooling medium exhaust manifold formed inside the fuel cell 10. The radiator 73 is connected to the cooling medium exhaust pipe 72 and the cooling medium supply pipe 71. The radiator 73 cools a cooling medium flowing from the cooling medium exhaust pipe 72 by the use of, for example, air sent from an electric fan (not shown), and then discharges the cooling medium to the cooling medium supply pipe 71. Therefore, a circulation path for the cooling medium is formed by the cooling medium exhaust pipe 72, the radiator 73, the cooling medium supply pipe 71, and the manifolds inside the fuel cell 10.

The circulation pump 74 is disposed in the cooling medium supply pipe 71. The circulation pump 74 feeds the cooling medium to the fuel cell 10 under pressure by the use of the driving force of the circulation pump 74. The three-way valve 75 adjusts the flow rate of the cooling medium to the radiator 73 and to the bypass pipe 76. The battery temperature acquisition unit 77 is disposed near the fuel cell 10 in the cooling medium exhaust pipe 72. The battery temperature acquisition unit 77 measures the temperature of the cooling medium in the cooling medium exhaust pipe 72 and transmits the temperature to the controller 20. In the present embodiment, the temperature of the cooling medium is used as fuel cell temperature.

The fuel cell 10 described above generates electric power by using hydrogen gas and air that are supplied by the above-described components. Generated electric power is supplied to a drive motor (not shown) for propelling the vehicle via an inverter (not shown). A high voltage side of the DC-DC converter 90 is connected to power lines that supply electric power from the fuel cell 10 to the drive motor. The DC-DC converter 90 steps up the output voltage of the fuel cell 10 in response to control that is executed by the controller 20. A current sensor 95 is provided between the fuel cell 10 and the DC-DC converter 90. The current sensor 95 measures a current flowing through the fuel cell 10. The current sensor 95 measures the output current value of the fuel cell 10.

The controller 20 controls the entire fuel cell system 100. The controller 20 includes a CPU 21 and a memory 25. The CPU 21 functions as a control unit 22 by executing a control program prestored in the memory 25.

The control unit 22 controls the operations of the fuel cell 10 and controller 20 by actuating or stopping various components electrically connected to the controller 20. The various components include the air compressor 33 and the hydrogen pump 65. In the present embodiment, the control unit 22 performs a shutdown scavenging operation (described later) before the operation is stopped by stopping the power generation of the fuel cell 10, more accurately, when the process of stopping the operation is started. In addition, the control unit 22 performs a soaking scavenging operation (described later) after a stop of the operation of the fuel cell 10. The shutdown scavenging operation and the soaking scavenging operation are collectively simply referred to as scavenging operation. In the fuel cell system 100, when the scavenging operation is performed, the amount of water remaining in the fuel cell 10 is reduced while freezing of water and moisture contained in off-gas that is discharged from the fuel cell 10 in the hydrogen pump 65 is minimized.

The scavenging operation includes a cathode-side scavenging operation and an anode-side scavenging operation. In the cathode-side scavenging operation, the control unit 22 supplies oxidant gas to the fuel cell 10 by driving the air compressor 33, thus discharging and draining cathode off-gas and water remaining in the fuel cell 10. In the anode-side scavenging operation, the control unit 22 closes the second on-off valve 53, and opens the exhaust drain valve 63. Then, the control unit 22 supplies hydrogen gas, discharged from the gas-liquid separator 62, to the fuel cell 10 by driving the hydrogen pump 65, thus discharging and draining anode off-gas and water remaining in the fuel cell 10.

The oxidant gas supply and exhaust unit 30 and the fuel gas supply and exhaust unit 50 may be regarded as subordinate concepts of the reactant gas supply unit in Summary. The fuel off-gas pipe 61 and the circulation pipe 64 may be regarded as subordinate concepts of the circulation passage in Summary. The hydrogen pump 65 may be regarded as a subordinate concept of the component in Summary. The hydrogen pump temperature acquisition unit 66 may be regarded as the component temperature acquisition unit in Summary. The SOC detection unit 96 may be regarded as the state-of-charge acquisition unit in Summary.

A2. Scavenging Operation

Figure 2:
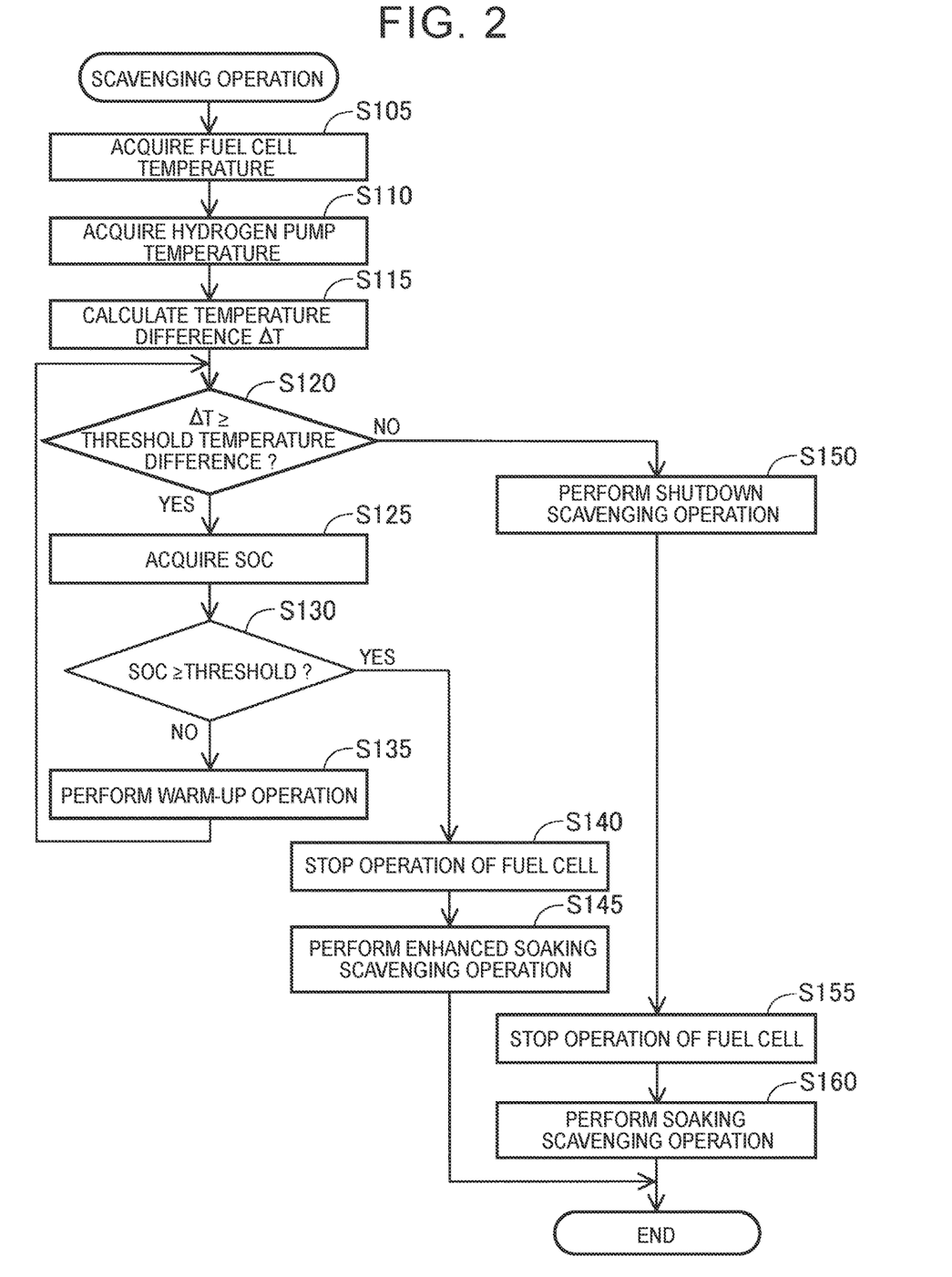
FIG. 2 is a flowchart showing the procedure of a scavenging operation.

FIG. 2 is a flowchart showing the procedure of the scavenging operation that is performed in the fuel cell system 100. In the fuel cell system 100, when a signal indicating that an ignition switch has switched from an on state to an off state is transmitted from an upper-level electronic control unit (ECU) that controls the entire vehicle and the signal is received by the controller 20, the scavenging operation shown in FIG. 2 is performed.

The control unit 22 acquires the fuel cell temperature from the battery temperature acquisition unit 77 (step S105). The control unit 22 acquires the hydrogen pump temperature from the hydrogen pump temperature acquisition unit 66 (step S110). Step S105 and step S110 may be executed in any order or may be executed at the same time. The control unit 22 calculates a temperature difference $\Delta T$ between the fuel cell temperature and the hydrogen pump temperature (step S115). The control unit 22 calculates a value obtained by subtracting the hydrogen pump temperature from the fuel cell temperature, as the temperature difference $\Delta T$. The control unit 22 determines whether the temperature difference $\Delta T$ is higher than or equal to a predetermined threshold temperature difference (step S120). In the present embodiment, the predetermined threshold temperature difference is 5° C. The predetermined threshold temperature difference may be set to any temperature within the range from 5° C. to 10° C., instead of 5° C.

When the control unit 22 determines that the temperature difference $\Delta T$ is less than the threshold temperature difference (5° C.) (NO in step S120), the control unit 22 performs the shutdown scavenging operation (step S150). Specifically, the control unit 22 performs the above-described cathode-side scavenging operation and anode-side scavenging operation at predetermined scavenging power. More specifically, in the anode-side scavenging operation, the control unit 22 sets the rotation speed of the hydrogen pump 65 to about 40% of the maximum rotation speed, and continues driving the hydrogen pump 65 at the set rotation speed for a predetermined period. In the present embodiment, the predetermined period is 60 seconds. The predetermined period may be set to any period within the range from 60 seconds to 80 seconds, instead of 60 seconds.

After completion of the shutdown scavenging operation, the control unit 22 stops the operation of the fuel cell 10 (step S155). The control unit 22 stops power generation of the fuel cell 10 by stopping supply of hydrogen gas and air to the fuel cell 10. Subsequently, the control unit 22 performs the soaking scavenging operation (step S160). In the present embodiment, soaking means a state where the ignition switch of the vehicle is off. Therefore, during soaking, the power of the controller 20 is also off. For this reason, in the present embodiment, the upper-level ECU that controls the entire vehicle controls electric power to be supplied to the controller 20, thus switching the power of the controller 20 from the off state to the on state and performing the soaking scavenging operation. Because the procedure of the soaking scavenging operation is the same as the procedure of the shutdown scavenging operation in step S150, the detailed description is omitted.

When the control unit 22 determines in step S120 that the temperature difference $\Delta T$ is greater than or equal to the threshold temperature difference (5° C.) (YES in step S120), the control unit 22 acquires the SOC of the secondary battery 92 from the SOC detection unit 96 (step S125). Subsequently, the control unit 22 determines whether the SOC is higher than or equal to a predetermined threshold (step S130). In the present embodiment, the predetermined threshold means, for example, 70%. The predetermined threshold may be set to any level not exceeding the upper limit of the SOC of the secondary battery 92, instead of 70%. When the control unit 22 determines that the SOC is not greater than or equal to the threshold (70%) (NO in step S130), the control unit 22 performs a warm-up operation (step S135). Specifically, the control unit 22 causes the fuel cell 10 to continue power generation. Electric power generated by the fuel cell 10 is stored in the secondary battery 92. When power generation of the fuel cell 10 is continued, hydrogen gas and water in the fuel off-gas pipe 61 and the circulation pipe 64 rise in temperature. As a result, the hydrogen pump 65 provided in the circulation pipe 64 is warmed up.

After completion of the warm-up operation, the process returns to step S120. Until the control unit 22 determines that the temperature difference $\Delta T$ is greater than or equal to the threshold temperature difference (5° C.) and the SOC is higher than or equal to the threshold (70%) as a result of charging the secondary battery 92 through power generation of the fuel cell 10, step S120 to step S135 are repeated.

When the control unit 22 determines in step S130 that the SOC is higher than or equal to the threshold (70%) (YES in step S130), the control unit 22 stops the operation of the fuel cell 10 (step S140). Because step S140 is the same as step S155, the detailed description is omitted. Subsequently, the control unit 22 performs an enhanced soaking scavenging operation (step S145). In the present embodiment, the enhanced soaking scavenging operation is performed when the fuel cell temperature becomes 4° C. This is because of the following reason. Generally, the density of water is the highest at 4.35° C. and gradually decreases with a rise in temperature from 4.35° C. Therefore, to further raise drainage performance in the fuel cell 10, it is preferable that a scavenging operation be performed in a state where the density of water is higher. That is, it is preferable that the scavenging operation be performed when the fuel cell temperature is close to 4.35° C. For this reason, the control unit 22 periodically acquires the fuel cell temperature from the battery temperature acquisition unit 77, and, when it is detected that the fuel cell temperature becomes 4° C., performs the enhanced soaking scavenging operation. The enhanced soaking scavenging operation may be performed not only at the time when the fuel cell temperature becomes 4° C. but also at any other timing after completion of step S140.

In the enhanced soaking scavenging operation, the control unit 22 performs the scavenging operation at scavenging power higher than the above-described predetermined scavenging power that is scavenging power for the shutdown scavenging operation (step S150) and the soaking scavenging operation (step S160). In the present embodiment, high scavenging power means that the circulation time of hydrogen gas is extended or the circulation amount is increased by controlling at least one of the rotation speed of the hydrogen pump 65, the driving time of the hydrogen pump 65, and the pressure of hydrogen gas, and thus enhancing power for emitting off-gas and water discharged from the fuel cell 10.

More specifically, the control unit 22 sets the rotation speed of the hydrogen pump 65 to the maximum rotation speed, and continues driving the hydrogen pump 65 at the set rotation speed for the predetermined period. At this time, the pressure of hydrogen gas in the fuel off-gas pipe 61 and the circulation pipe 64 decreases and becomes a negative pressure relative to atmospheric pressure. Therefore, the control unit 22 increases the pressure of hydrogen gas measured by the second pressure gauge 56 to 100 kPa by controlling the second on-off valve 53, the second pressure regulating valve 54, and the injector 55. As the addition of pressure to hydrogen gas completes, the control unit 22 opens the exhaust drain valve 63. As the exhaust drain valve 63 is opened, the pressure of hydrogen gas decreases again. Therefore, the control unit 22 repeats addition of pressure to hydrogen gas and opening of the exhaust drain valve 63 while driving the hydrogen pump 65. Thus, as compared to the above-described soaking scavenging operation, discharge and drainage of hydrogen gas and water in the fuel off-gas pipe 61 and the circulation pipe 64 are enhanced. The predetermined period in step S145 means 90 seconds. The predetermined period is not limited to 90 seconds. The predetermined period may be set to a period longer than or equal to 90 seconds or may be set to any other period as long as the period is longer than the predetermined period in the soaking scavenging operation. The cathode-side scavenging operation in step S145 is the same as the cathode-side scavenging operation in step S150 and the cathode-side scavenging operation in step S160.

In this way, in the present embodiment, when the temperature difference ΔT between the fuel cell temperature and the hydrogen pump temperature is greater than or equal to the predetermined threshold temperature difference (5° C.) and the SOC is lower than the threshold (70%), the warm-up operation is performed, and then the enhanced soaking scavenging operation is performed. In this case, the temperatures of hydrogen gas and water in the fuel off-gas pipe 61 and the circulation pipe 64 are raised through the warm-up operation, and the hydrogen pump 65 provided in the fuel off-gas pipe 61 is warmed up. Therefore, even when outside air temperature is low and, therefore, the temperature of the hydrogen pump 65 is low, the scavenging operation is performed in a state where the temperature of the hydrogen pump 65 is raised. As a result, freezing of water in the fuel off-gas pipe 61 and the circulation pipe 64 is minimized. When the SOC of the secondary battery 92 is higher than or equal to 70% at the time when the scavenging operation shown in FIG. 2 is started, the enhanced soaking scavenging operation is performed without the warm-up operation. In this case, in comparison with the case where the enhanced soaking scavenging operation is performed after completion of the warm-up operation, the scavenging operation may be performed at further enhanced scavenging power.

While step S120 to step S135 are being repeated, when it is determined in step S120 that the temperature difference ΔT is less than the threshold temperature difference (5° C.) (NO in step S120), step S150 is executed.

After completion of step S145 or after completion of step S160, the scavenging operation is stopped.

With the fuel cell system 100 having the above configuration according to the first embodiment, when the temperature difference ΔT that is the difference between the acquired fuel cell temperature and the acquired hydrogen pump temperature is greater than or equal to the predetermined temperature difference (5° C.), the warm-up operation of the fuel cell 10 is performed and electric power generated through the warm-up operation is stored in the secondary battery 92 while the SOC of the secondary battery 92 is lower than the predetermined SOC (70%), and the scavenging operation is performed after completion of the warm-up operation. Therefore, the scavenging operation of the fuel cell 10 is performed in a state where the temperature of the hydrogen pump 65 is raised through the warm-up operation.

As a result, the remaining amount of off-gas and water flowing into the hydrogen pump 65 is reduced, and freezing of water and moisture contained in off-gas in the hydrogen pump 65 is minimized even when outside air temperature is low and, therefore, the temperature of the hydrogen pump 65 is low. Therefore, at the time of next startup of the fuel cell 10, a malfunction of power generation resulting from blockage of part or all of the circulation pipe 64 is reduced.

When the temperature difference ΔT is greater than or equal to the predetermined temperature difference (5° C.) at the time when the SOC of the secondary battery 92 has reached the predetermined SOC (70%) in the warm-up operation, the scavenging operation is performed at scavenging power higher than the predetermined scavenging power after completion of the warm-up operation. Therefore, power in the hydrogen pump 65 for emitting off-gas and water discharged from the fuel cell 10 is enhanced. As a result, even when the temperature difference ΔT is greater than or equal to the predetermined temperature difference after completion of the warm-up operation, freezing of water and moisture contained in off-gas in the hydrogen pump 65 is minimized.

B. Second Embodiment

The fuel cell system 100 in a second embodiment is similar to the fuel cell system 100 in the first embodiment shown in FIG. 1, so the detailed description thereof is omitted.

Figure 3:
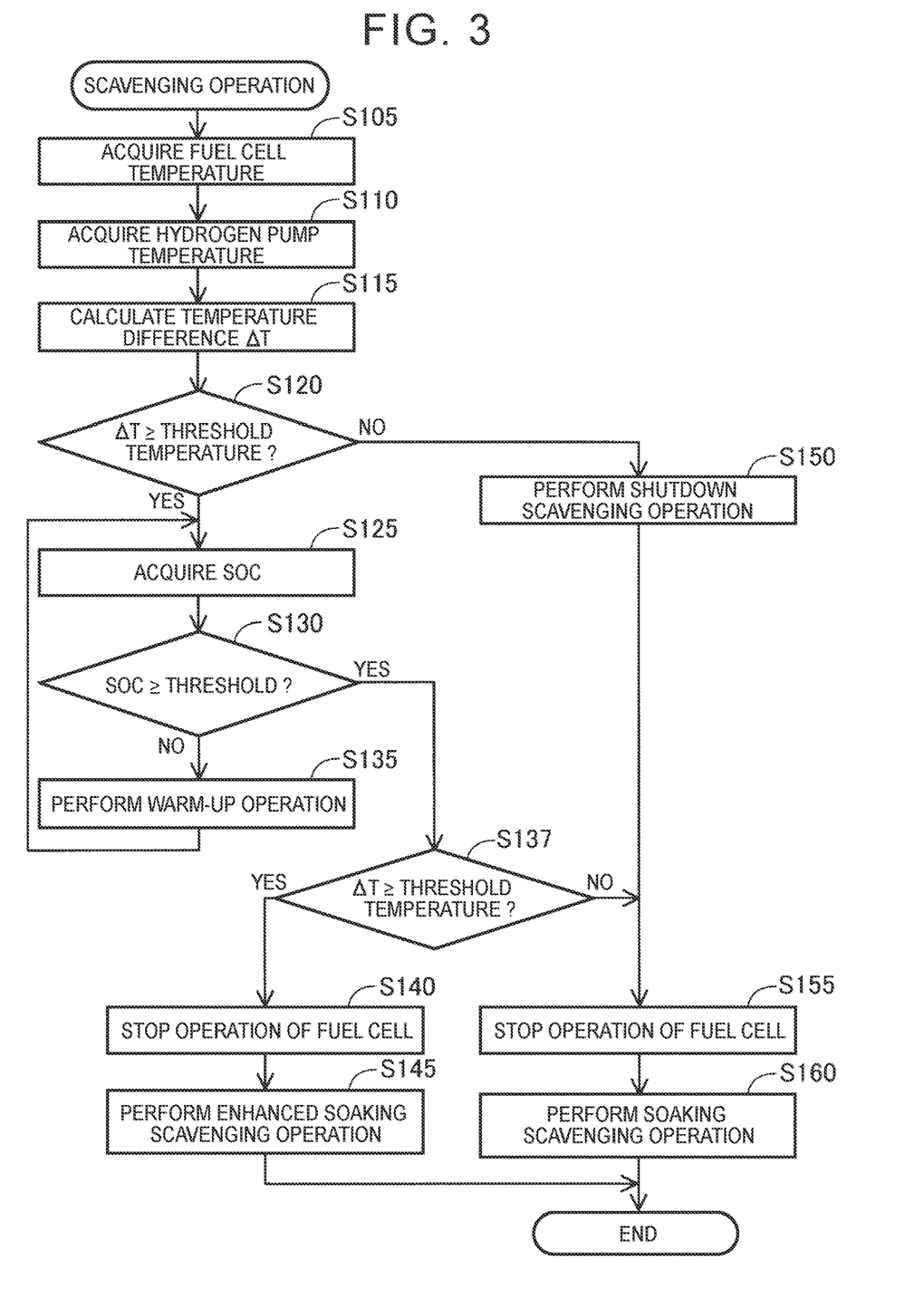
FIG. 3 is a flowchart showing the procedure of a scavenging operation in a second embodiment.

FIG. 3 is a flowchart showing the procedure of a scavenging operation in the second embodiment. The scavenging operation in the second embodiment differs from the scavenging operation in the first embodiment shown in FIG. 2 in that the procedure after completion of step S135 is modified and step S137 is added. The remaining procedure of the scavenging operation of the second embodiment is the same as the scavenging operation of the first embodiment, so like step numbers denote the same steps, and the detailed description thereof is omitted.

As shown in FIG. 3, when the warm-up operation is performed (step S135), the process returns to step S125. Until it is determined that the SOC of the secondary battery 92 is higher than or equal to the threshold (70%) as a result of charging the secondary battery 92 through power generation of the fuel cell 10, step S125 to step S135 are repeated.

When the control unit 22 determines in step S130 that the SOC is higher than or equal to the threshold (70%) (YES in step S130), the control unit 22 determines whether the temperature difference ΔT is greater than or equal to the threshold temperature difference (5° C.) (step S137). Step S137 is similar to step S120, so the detailed description is omitted. When the control unit 22 determines that the temperature difference ΔT is greater than or equal to the threshold temperature difference (5° C.) (YES in step S137), the control unit 22 executes step S140 and step S145. On the other hand, when the control unit 22 determines that the temperature difference ΔT is less than the threshold temperature difference (5° C.) (NO in step S137), the control unit 22 executes step S155 and step S160.

With the fuel cell system 100 having the above configuration according to the second embodiment, similar advantageous effects to those of the first embodiment are obtained. In addition, since it is determined whether the temperature difference ΔT is greater than or equal to the threshold temperature difference (5° C.) after the SOC becomes higher than or equal to the threshold (70%), whether to perform any one of the soaking scavenging operation and the enhanced soaking scavenging operation is accurately determined.

C. Third Embodiment

The fuel cell system 100 in a third embodiment is similar to the fuel cell system 100 in the first embodiment shown in FIG. 1, so the detailed description thereof is omitted.

Figure 4:
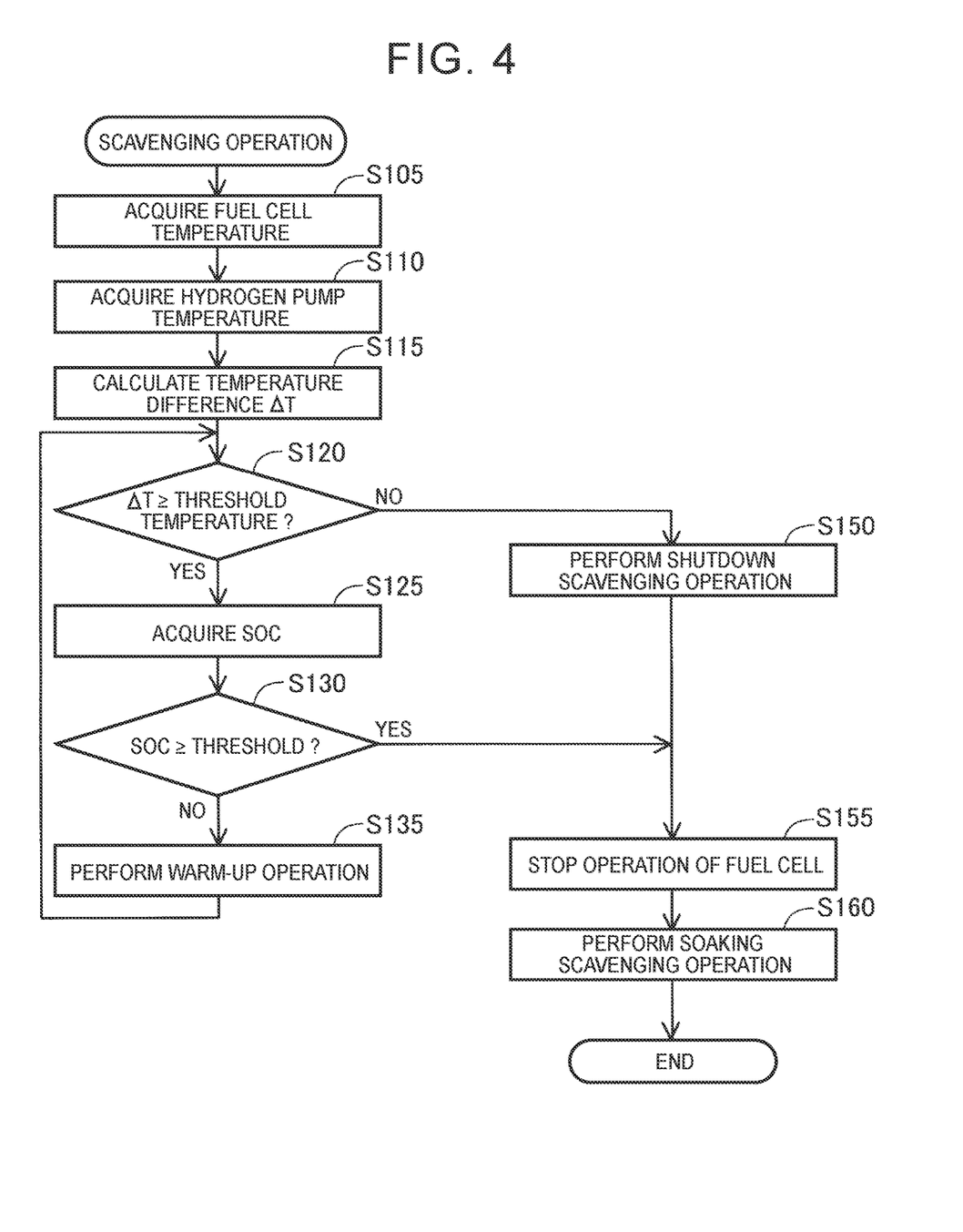
FIG. 4 is a flowchart showing the procedure of a scavenging operation in a third embodiment.

FIG. 4 is a flowchart showing the procedure of a scavenging operation in the third embodiment. The scavenging operation in the third embodiment differs from the scavenging operation in the first embodiment shown in FIG. 2 in that step S140 and step S145 are omitted. The remaining procedure of the scavenging operation of the third embodiment is the same as the scavenging operation of the first embodiment, so like step numbers denote the same steps, and the detailed description thereof is omitted.

As shown in FIG. 4, when it is determined in step S130 that the SOC is higher than or equal to the threshold (70%) (YES in step S130), step S155 and step S160 are executed.

With the fuel cell system 100 having the above configuration according to the third embodiment, when the temperature difference $\Delta T$ that is the difference between the acquired fuel cell temperature and the acquired hydrogen pump temperature is greater than or equal to the predetermined temperature difference (5° C.), the warm-up operation of the fuel cell 10 is performed and electric power generated through the warm-up operation is stored in the secondary battery 92 while the SOC of the secondary battery 92 is lower than the predetermined SOC (70%), and, after completion of the warm-up operation, the scavenging operation is performed. Therefore, the scavenging operation of the fuel cell 10 is performed in a state where the temperature of the hydrogen pump 65 is raised through the warm-up operation. As a result, the remaining amount of water and moisture contained in off-gas flowing into the hydrogen pump 65 is reduced, and freezing of water and moisture contained in off-gas in the hydrogen pump 65 is minimized even when outside air temperature is low and, therefore, the temperature of the hydrogen pump 65 is low. Therefore, at the time of next startup of the fuel cell 10, a malfunction of power generation resulting from blockage of part or all of the circulation pipe 64 is reduced. In addition, the single soaking scavenging operation is performed as the scavenging operation during soaking, so scavenging control is simplified.

D. Alternative Embodiments

D1. First Alternative Embodiment

In the above-described embodiments, the temperature of the hydrogen pump 65 is used as the component temperature; however, the disclosure does not limit the component temperature to the temperature of the hydrogen pump 65. For example, the temperature of the gas-liquid separator 62 may be used as the component temperature. Alternatively, for example, the temperature of the three-way valve 75 may be used as the component temperature. That is, generally, with the configuration that the temperature of a component provided in the circulation passage for off-gas that is discharged from the fuel cell 10 is used as the component temperature, similar advantageous effects to those of the above-described embodiments are obtained.

D2. Second Alternative Embodiment

In the above-described embodiments, the temperature of the cooling medium, measured by the battery temperature acquisition unit 77, is used as the fuel cell temperature; however, the disclosure does not limit the fuel cell temperature to the temperature of the cooling medium. For example, the temperature of another component, which correlates with the fuel cell temperature, may be used as the fuel cell temperature. Alternatively, for example, a current fuel cell temperature may be estimated from a previously acquired fuel cell temperature. Alternatively, for example, a fuel cell temperature may be calculated by an experiment, or the like, in advance to formulate a function or a map. With such a configuration as well, similar advantageous effects to those of the above-described embodiments are obtained.

D3. Third Alternative Embodiment

In the above-described embodiments, the enhanced soaking scavenging operation (step S145) is performed when the temperature difference $\Delta T$ is greater than or equal to the threshold temperature difference (5° C.) and the SOC of the secondary battery 92 is higher than or equal to the predetermined SOC (70%); however, the disclosure does not limit the condition of the enhanced soaking scavenging operation. For example, when the control unit 22 detects irregular manipulation, such as removing the terminals of the secondary battery 92, the enhanced soaking scavenging operation may be performed. With such a configuration as well, similar advantageous effects to those of the above-described embodiments are obtained.

D4. Fourth Alternative Embodiment

In the above-described embodiments, the anode-side scavenging operation is enhanced in the enhanced soaking scavenging operation (step S145). Instead or in addition to this, the cathode-side scavenging operation may be enhanced. For example, the cathode-side scavenging operation may be enhanced by making the driving duration of the air compressor 33 longer than the driving duration of the air compressor 33 in the soaking scavenging operation and setting the first pressure regulating valve 42 to a fully open state. Thus, power for emitting off-gas and water in the oxidation off-gas pipe 41 and the first pressure regulating valve 42 is enhanced. With such a configuration as well, similar advantageous effects to those of the above-described embodiments are obtained.

The disclosure is not limited to the above-described embodiments and alternative embodiments, and may be implemented in various configurations without departing from the purport of the disclosure. For example, technical features in the embodiments and alternative embodiments, corresponding to the technical features in the aspect described in Summary, may be replaced or combined as needed to solve part or all of the above-described inconvenience or to achieve part or all of the above-described advantageous effects. Unless the technical features are specified as indispensable features in the specification, the technical features may be omitted as needed.

What is claimed is:
1. A fuel cell system comprising:
a fuel cell;
a reactant gas supply unit configured to supply reactant gases to the fuel cell;
a component provided in a circulation passage for off-gas that is discharged from the fuel cell;
a battery temperature acquisition unit configured to acquire a fuel cell temperature that is a temperature of the fuel cell;

a component temperature acquisition unit configured to acquire a component temperature that is a temperature of the component;

a secondary battery;

a state-of-charge acquisition unit configured to acquire a state of charge of the secondary battery; and a controller programmed to perform a scavenging operation of the fuel cell at a time of a stop of power generation of the fuel cell system, the controller being programmed to, when a temperature difference that is a difference between the acquired fuel cell temperature and the acquired component temperature is greater than or equal to a predetermined temperature difference, perform a warm-up operation of the fuel cell and store electric power generated through the warm-up operation in the secondary battery while the state of charge of the secondary battery is lower than a predetermined state of charge, and the controller being programmed to, after completion of the warm-up operation, perform the scavenging operation at predetermined scavenging power.

2. The fuel cell system according to claim 1, wherein the controller is programmed to, when the temperature difference is greater than or equal to the predetermined temperature difference at a time when the state of charge of the secondary battery has reached the predetermined state of charge in the warm-up operation, perform the scavenging operation at scavenging power higher than the predetermined scavenging power after completion of the warm-up operation.

3. The fuel cell system according to claim 1, wherein:

the off-gas is anode off-gas;

the reactant gas supply unit includes a hydrogen gas tank and an anode gas passage that connects the hydrogen gas tank to the fuel cell;

the circulation passage includes an exhaust passage through which the anode off-gas that is discharged from the fuel cell flows and an auxiliary circulation passage that connects the exhaust passage to the anode gas passage; and the component is a pump disposed in the auxiliary circulation passage.

* * * * *